(12) United States Patent
Emma

(10) Patent No.: US 7,986,543 B2
(45) Date of Patent: *Jul. 26, 2011

(54) METHOD FOR ACHIEVING VERY HIGH BANDWIDTH BETWEEN THE LEVELS OF A CACHE HIERARCHY IN 3-DIMENSIONAL STRUCTURES, AND A 3-DIMENSIONAL STRUCTURE RESULTING THEREFROM

(75) Inventor: Philip George Emma, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 108 days.

This patent is subject to a terminal disclaimer.

(21) Appl. No.: 12/116,771

(22) Filed: May 7, 2008

(65) Prior Publication Data

US 2008/0209126 A1  Aug. 28, 2008

Related U.S. Application Data

(63) Continuation of application No. 11/453,885, filed on Jun. 16, 2006, now Pat. No. 7,616,470.

(51) Int. Cl.
*G11C 11/00* (2006.01)
(52) U.S. Cl. .................. 365/129; 711/122; 711/141
(58) Field of Classification Search .................. 365/129, 365/170, 226, 227, 32, 130, 185.33; 711/141, 711/122, 137, 163, 165, 105
See application file for complete search history.

(56) References Cited

U.S. PATENT DOCUMENTS

| 5,133,061 | A | * | 7/1992 | Melton et al. | 711/128 |
|---|---|---|---|---|---|
| 6,059,835 | A | * | 5/2000 | Bose | 703/19 |
| 6,175,160 | B1 | | 1/2001 | Paniccia et al. | |
| 7,130,967 | B2 | | 10/2006 | Arimilli et al. | |
| 2002/0010836 | A1 | * | 1/2002 | Barroso et al. | 711/122 |
| 2003/0005215 | A1 | | 1/2003 | Arimilli et al. | |
| 2005/0086651 | A1 | * | 4/2005 | Yamamoto et al. | 717/140 |
| 2006/0113653 | A1 | | 6/2006 | Xiaqqi et al. | |
| 2006/0184743 | A1 | * | 8/2006 | Guthrie et al. | 711/133 |
| 2007/0079216 | A1 | * | 4/2007 | Bell et al. | 714/763 |
| 2007/0192545 | A1 | * | 8/2007 | Gara et al. | 711/141 |
| 2007/0283100 | A1 | * | 12/2007 | Asano et al. | 711/125 |

OTHER PUBLICATIONS

Kimura, M., "Bridging the Gap Between Packages and Chips: 10MUM Super Sonnect Technology.", Solid State Technology, Pennwell Corporation, Tulsa OK, US, vol. 43, No. 11, Nov. 1, 2000, pp. 56, 58, 60.
International Search Report dated Nov. 6, 2008.

* cited by examiner

*Primary Examiner* — Dang T Nguyen
(74) *Attorney, Agent, or Firm* — McGinn Intellectual Property Law Group, PLLC

(57) ABSTRACT

A method of electronic computing, and more specifically, a method of design of cache hierarchies in 3-dimensional chips, and a cache hierarchy resulting therefrom, including a physical arrangement of bits in cache hierarchies implemented in 3 dimensions such that the planar wiring required in the busses connecting the levels of the hierarchy is minimized. In this way, the data paths between the levels are primarily the vias themselves, which leads to very short, hence fast and low power busses.

29 Claims, 6 Drawing Sheets

METHOD FOR ACHIEVING VERY HIGH BANDWIDTH BETWEEN THE LEVELS OF A CACHE HIERARCHY IN 3-DIMENSIONAL STRUCTURES, AND A 3-DIMENSIONAL STRUCTURE RESULTING THEREFROM

The present application is a Continuation Application of U.S. patent application Ser. No. 11/453,885, filed Jun. 16, 2006 now U.S. Pat. No. 7,616,470.

BACKGROUND OF THE INVENTION

1. Field of the Invention

The present invention generally relates to a method for electronic computing, and more specifically, to a method for design of cache hierarchies in 3-dimensional chips, and 3-dimensional cache hierarchy structures resulting therefrom.

2. Description of the Related Art

The present invention provides a method in which a natural synergy is achieved by marrying two evolving fields of endeavor, which has not been recognized by the conventional methods.

First, recent work has demonstrated the viability of interconnecting two or more planes of circuits by thinning those planes (e.g., to a few hundred microns or less), etching dense via patterns in them, and then interconnecting them with metalization processes. The resulting structure is a monolithic "chip" including multiple planes of circuits. This advance is quite literally a new dimension in the scaling of circuit density.

Second, as circuit density has scaled, single chips have grown to contain more and more of the computer system. Two decades ago, it was a revelation that an entire processor could fit on a single chip. At the 180 nanometer CMOS node, it was a revelation that not only the processor's Level-1 cache (L1) was contained, but for the first time it was also feasible to include the next level of cache, L2, on the chip with the processor. Additionally, about a decade ago, the first single-chip multiprocessors began being produced.

At densities facilitated at the 90 nanometer node and beyond, together with the aforementioned ability to create 3-dimensional structures, single chip systems of the future will contain not only multiple processors, but also multiple levels of the cache hierarchy.

The access time of a cache is determined, to a large extent, by its area. Therefore, a processor's Level-1 cache (L1), which is integral to the processor pipeline itself is kept small so that its access time is commensurate with the processor speed, which today can be several Gigahertz. Because the L1 is small, it cannot contain all of the data that will be used by the processor when running programs. When the processor references a datum that is not contained within the L1, this is called an L1 "cache miss."

In the event of an L1 miss, the reference is forwarded to the next level in the hierarchy (say, L2), to determine whether the datum is there.

If the requested datum is in the L2 cache, then data (including the datum that was specifically referenced) are moved from the L2 cache to the L1 cache, and the original reference is satisfied.

If the referenced datum is not in the L2 cache, then this is also a "cache miss" (an L2 "cache miss"), and the reference continues to percolate up the hierarchy (e.g., say, to L3 and above). By convention, higher levels in a cache hierarchy are physically larger (and hence, hold more data), and thus, progressively slower.

Data in a cache are stored in "lines," which are contiguous chunks of data (i.e., being a power-of-2 number of bytes long, aligned on boundaries corresponding to this size). Thus, when a cache miss is serviced, it is not merely the specific datum that was requested that is moved down the hierarchy. Instead, the entire cache line containing the requested datum is moved. Data are stored in "lines" for two reasons.

First, each entry in a cache has a corresponding directory entry (e.g., in a cache directory) that contains information about the cache entry. If each byte in a cache were given its own entry, there would be a prohibitive number of directory entries (i.e., equal to the number of bytes in the cache) making the administrative overhead for the cache (the directory) huge. Thus, instead, there is one directory entry per cache line (which is typically between 32-256 bytes today, depending on the processor).

Second, program reference patterns exhibit what is called "spatial locality of reference," meaning that if a particular datum is referenced, then it is very likely that other data that are physically proximate (e.g., by address) to the referenced datum will also be referenced. Thus, by bringing in an entire cache line, more of the spatial context of the program is captured, thereby reducing the number of misses.

The bandwidth between levels in a hierarchy is equal to the amount of data that is moved per unit of time. It is noted that the bandwidth includes both necessary movement (e.g., the data that are actually used) and unnecessary movement (e.g., data that are not ever referenced).

To achieve high performance in a processor, it is important to not take many misses, since misses are a dominant component of delay. One method of reducing the number of misses incurred is to anticipate what might be used by a running program, and to "prefetch" that data down the hierarchy before it is referenced. In this way, if the program actually does reference what was anticipated, there is no miss. However, the more a processor speculates about what might be referenced (so as to prefetch), the more unnecessary movement takes place, since some of what is anticipated will be wrong. This means that facilitating higher performance by the elimination of misses will require more bandwidth.

The actual bandwidth used (as defined above) is the amount of data moved per unit time. If the program runs fast, the unit of time will be shorter, hence the bandwidth higher. Notice the distinction between the actual bandwidth, and the "bandwidth capacity," which is equal to the maximum amount of data that could be moved if the busses were 100% utilized. Bandwidth capacity is equal to the width of the bus (in bytes) times the bus frequency.

For example, if an 8-byte bus runs at 1 Gigahertz, then the bandwidth capacity of the bus is 8 Gigabytes per second. It is noted also that if the processor runs at 2 Gigahertz, then the bus is 2 times slower than the processor. And if the cache line size is 128 bytes, then the 8-byte bus requires 16 bus cycles (which is 2×16=32 processor cycles) to move a cache line. Some of the data that is moved during these 32 processor cycles is useless. Further, if a subsequent miss occurs during the large window in which this cache line is being moved, the subsequent miss can be further delayed by the bus transfer that is already in progress.

For this reason, it is important to have a bandwidth capacity that is much larger than the actual bandwidth demand. Very high bandwidth facilitates two things that are crucial to high performance computing.

First, very high bandwidth allows cache lines to be transferred very quickly so that the transfers will not interfere with other miss traffic in the system. (For example, if the bus above were 128 bytes wide and ran at 3 Gigahertz, it could transfer the cache line in a single processor cycle.)

Second, having an ample surplus of bandwidth capacity facilitates operations like prefetching, which will place a much higher bandwidth demand on the system.

The reason that bus widths tend to be much narrower than cache line sizes (e.g., 8 bytes instead of 128 bytes) is that planar wiring capability is limited. Because these busses tend to be long, they also tend to be wired in high-level (e.g., relatively thick or fat) wire to minimize resistance so as to maximize speed. Wide busses (e.g., much wider than 8 bytes) would impose considerable blockages on the upper levels of metal, so they are generally not used.

Busses tend to be slower than processors (e.g., 1 Gigahertz instead of 2 Gigahertz) because they are too long (e.g., 5-10 millimeters or more) since they are connecting large aerial structures (caches) in a plane.

SUMMARY OF THE INVENTION

In view of the foregoing and other exemplary problems, drawbacks, and disadvantages of the conventional methods and structures, an exemplary feature of the present invention is to provide a method which maximize the number of interconnections between the levels in a cache hierarchy so as to maximize the bus widths, and the cache hierarchy resulting from such a novel method.

Particularly, the present invention provides a method in which a natural synergy is achieved by marrying two evolving fields of endeavor, which has not been recognized by the conventional methods.

An exemplary feature of the present invention is to minimize the bus wire lengths between the levels in a cache hierarchy so as to maximize the bus speed and so as to minimize the energy required per transfer.

In a first aspect of the present invention, a method for arranging bits within a cache hierarchy implemented on multiple physical planes such that horizontal wiring distances in intra-level busses are minimized, includes physically partitioning each cache level into cache islands, each cache island including a subset of congruence classes, wherein the partitioning is performed in correspondence across cache levels such that a "cache island" containing specific congruence classes at one cache level are directly above or below the corresponding cache island which contains the corresponding congruence classes of an adjacent cache level, i.e., physically positioning each cache island directly over the corresponding cache islands of different cache levels.

In yet another aspect of the present invention, a method of deploying computing infrastructure in which recordable, computer-readable code is integrated into a computing system, and combines with the computing system for arranging bits within a cache hierarchy implemented on multiple physical planes such that horizontal wiring distances in intra-level busses are minimized, includes physically partitioning each cache level into cache islands, each cache island including a subset of congruence classes, wherein the partitioning is performed in correspondence across cache levels such that the congruence classes within a cache island at one cache level correspond to a same congruence classes within a corresponding cache island at another cache level, and physically positioning each cache island directly over the corresponding cache islands of different cache levels.

In another aspect of the present invention, a computer-readable medium tangibly embodying a program of machine readable instructions executable by a digital processing apparatus performs a method program for causing a computer to perform the exemplary methods described herein.

In the present invention, a method is provided for the physical arrangement of the bits in cache hierarchies implemented in three (3) dimensions, so as to minimize the planar wiring required in the busses connecting the levels of the hierarchy. In this way, the data paths between the levels are primarily determined by the vias themselves. This leads to very short, (and hence fast) and low power busses.

In the present invention, the bits within each level of a cache hierarchy are so arranged such that transfers between levels in the hierarchy do not involve very much of the planar wiring in any level. The present invention restricts bit placement within the plane by grouping the bits in accordance with two (orthogonal) criteria such that the movement between cache levels is nearly completely vertical in a 3-dimensional structure.

For example, the present inventors have recognized that an emerging technology is the ability to make 3-dimensional structures by thinning chips, laminating them together, and interconnecting them with though-vias in an areal grid. However, such structures provide very wide interconnecting busses.

The present invention provides for interconnecting multiple planes of memory together on a wide vertical bus to provide unprecedented amounts of bandwidth between adjacent levels in a cache hierarchy. The present invention provides a method for organizing the bits within the arrays of the adjacent levels so that minimal x-y wiring is required to transfer data. In this way, the wide bus can be almost entirely vertical, and also can be very short (e.g., a few hundreds microns). This provides a bus that can run at much higher speed, and much lower power than conventional 2-dimensional busses.

BRIEF DESCRIPTION OF THE DRAWINGS

The foregoing and other exemplary purposes, aspects and advantages will be better understood from the following detailed description of exemplary aspects of the invention with reference to the drawings, in which.

DETAILED DESCRIPTION OF EXEMPLARY ASPECTS OF THE INVENTION

Figure 1:
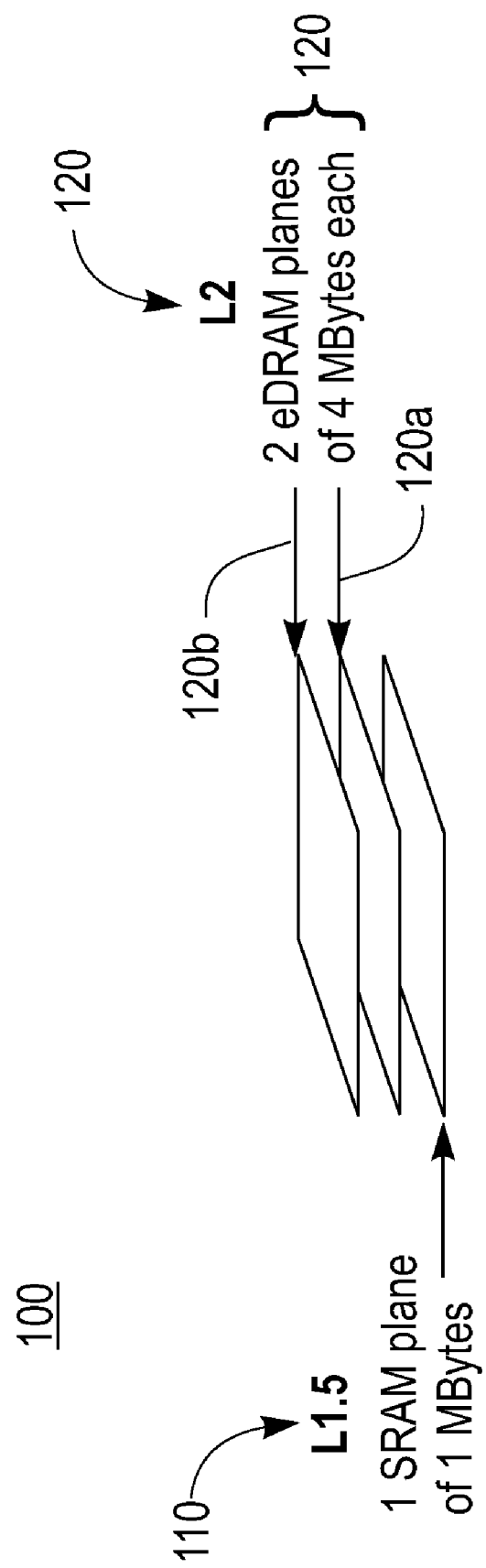
FIG. 1 exemplarily illustrates a cache hierarchy showing an L1.5 SRAM plane and an L2 including two planes of eDRAM.

Referring now to the drawings, and more particularly, to FIGS. 1-6, there are shown exemplary aspects of the method and structures according to the present invention.

For the purposes of illustrating the principle concepts of the present invention, herein will be first focused on a simple 2-level hierarchy comprising an L1.5 cache and an L2 cache.

Roughly speaking, it is a good rule of thumb that adjacent levels in a hierarchy have a capacity difference of an order of magnitude or so. In this example, the L1.5 is taken to be 1 Megabyte, and the L2 is 8 Megabytes.

First, these caches can be arranged so that they are in "aerial correspondence." That is, the areas of the two caches can be made approximately the same. One of them can be placed on top of the other. This is preferred (e.g., required) so that when moving data between the two levels, large horizontal movements are not required. Preferably, substantially only vertical movements will be needed. Then, the bits of the two caches will be arranged so that the physically corresponding bits (between the two levels) are in identical x-y (planar) proximities. This will eliminate the need for much x-y (planar) wiring in the intra-planar communication paths.

Although the capacity of the L2 is (in this case) 8× larger than the capacity of the L1.5, the invention preferably makes them aerially commensurate by using different circuit densities, and by using multiple planes of storage.

For example, let the L1.5 be implemented in 6T SRAM, and let the L2 be implemented in embedded DRAM (eDRAM). For argument's sake, assume that eDRAM offers a 4× density improvement over SRAM. To facilitate an 8× capacity difference then requires two planes of eDRAM to implement the L2 to correspond to a single plane of SRAM for the L1.5. FIG. 1 shows this basic arrangement.

That is, FIG. 1 illustrates a cache hierarchy structure 100 showing an L1.5 SRAM plane 110 (having for example 1 MB of SRAM) and an L2 cache 120 comprising two planes of eDRAM 120A, 12B (having 4 MBs for example).

Assuming a 0.65 square micron SRAM cell with a 75% array efficiency, 1 Megabyte of SRAM is approximately 8.2 square millimeters. Using this number, a total area in the neighborhood of 10 square millimeters can be aimed for (after having de-rated the array efficiency to account for rearranging the bits, and after having put in an aerial array of vias).

In this exemplary embodiment, a line size of 256 bytes is chosen. The 1 Megabyte L1.5 then has 4K lines, and the 8 Megabyte L2 has 32K lines. The set associativity of the L1.5 is chosen as 8-way, and the set associativity of the L2 is chosen as 16-way. This makes the number of congruence classes in the L1.5 be 4K/8=512, and the number of congruence classes in the L2 be 32K/16=2K. These geometries are shown in FIG. 2.

Figure 2A:
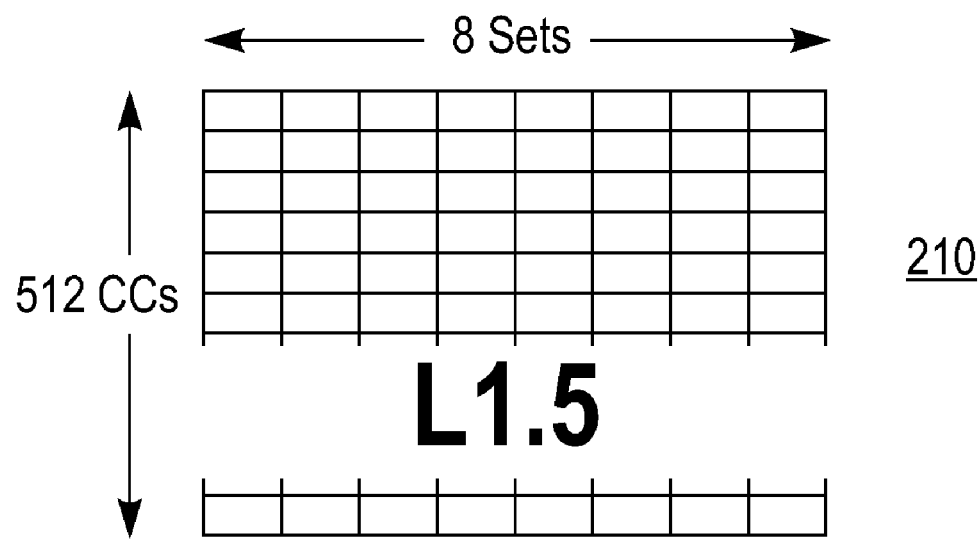
FIG. 2 logically illustrates cache geometries for L1.5 and L2 caches, according to exemplary aspects of the present invention.
Figure 2B:
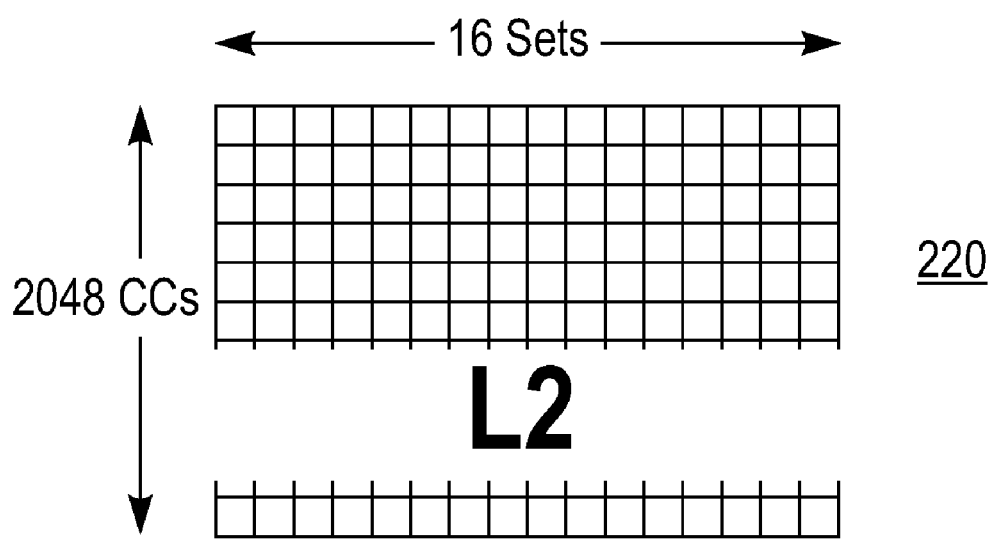

That is, FIG. 2 logically illustrates exemplary cache geometries 210, 220 for L1.5 and 2 caches, respectively.

Because this is a composite L1.5/L2 structure, a combined L1.5/L2 directory is chosen to be constructed, in SRAM, and put it on the SRAM plane, although this is arbitrary, and not essential to the present invention. Basically, a "combined" directory is really an L2 directory (having 32K entries), where each entry has an additional field to specify its status (MESI) in the L1.5, in the case that the corresponding data is resident in the L1.5. This was estimated to take about 1.6 square millimeters, assuming 8 bytes for a directory entry.

On a directory search, if there is an L1.5 miss and an L2 hit, then the directory should identify the line in the L2 that is to be brought into the L1.5, and it should choose the location (set within congruence class) in the L1.5 into which it is to be placed. Therefore, it should select one of 32K lines in the L2, which it can do by transmitting as few as 15 bits up to the L2 plane, or as many as 32K select signals, depending on how many vias are desired for use, and where one wishes to place decoders. The choice here is arbitrary (with regard to teaching this invention), albeit important to the goals of the design. The point is that the number of vias used for this can be small.

Initially, a goal is to maximize the width of the data bus. For a 256-byte line, were a line to be moved in a single transfer, it would require 2304 signals (256 bytes×9 bits per byte). Using one signal via per power via requires a total count of about 5000 vias to do this (together with address selects and various control signals). Using a via size of 16 square microns yields a total via area of 0.08 square millimeters. So in fact, if allowed a total via area overhead of 20% (of the 10 square millimeter area target), 32 such busses could be placed in use, and as many as 32 cache lines (this is 8 Kilobytes) to be moved simultaneously in an area of about 12 square millimeters.

While this amount of bandwidth capacity is staggering by today's standards, the question remains as to how to route this many signals (say 2500×32=80K) in a feasible way, and so that those wires are very short.

The first observation made is that, of all of the bits in the L2 (8 Megabytes×9 bits per byte=72 Megabits) and of all of the bits in the L1.5 (9 Megabits), it is not the case that any of the 72 Megabits in the L2 can be moved to any of the 9 Megabits in the L1.5. In fact, for any particular bit in the L1.5, there are only 64 bits in the L2 that can map into that particular bit. This is true for two independent reasons as described below. The present invention physically arranges the bits of the L1.5 and L2 so that only those bits of the L2 that can map to a bit in the L1.5 are above it.

A first (and trivial) reason for this mapping limitation, is that each bit in a cache line occupies a unique position. That is, a line is a contiguous and ordered group of 256 bytes, and each of those bytes is a contiguous and ordered group of 9 bits. Therefore, there are 2304 unique bit positions in a cache line. When a line is moved from the L2 to the L1.5, bit 0 of the L2 line is placed into bit position 0 in the L1.5 line, bit 1 of the L2 line is placed into bit position 1 in the L1.5 line, and so on. Bit 0 (and all other bits) can only be placed into its corresponding bit position. It cannot be placed into any other bit position.

Secondly, and less obviously, for any congruence class in the L1.5, there are only a handful of congruence classes in the L2 that can map to it. Specifically, if there are n1 congruence classes in the L1.5, and n2 congruence classes in the L2, then only n2/n1 L2 congruence classes can map to a given L1.5 congruence class. In the example being shown, the numbers are 2K/512=4 L2 congruence classes per L1.5 congruence class. Further, those L2 congruence classes cannot map to any other L1.5 congruence class.

To put it differently, the L1.5/L2 combination can be viewed as 512 (the number of L1.5 congruence classes) independent L1.5/L2 sub-caches, each in its own little island with its own bus between the L1.2 and L2. Each subcache is an L1.5 congruence class and the set of L2 congruence classes that map to it. Therefore, the 1M L1.5/8M L2 aggregation can be thought of as 512 independent 2K L1.5/16K L2 aggregations, and each of those have 2304 independent bit positions.

It is noted that a line coming from the L2 (which can reside in any of the 16 sets of the 4 congruence classes of its sub-cache) can be placed into any of the 8 sets of the L1.5 congruence class. If the cache is partitioned down to the bit position, it means that there are 16×4=64 bits in the L2 that can map to any of 8 bits (the set associativity of the L1.5) in the L1.5. Thus, conceivably, the smallest "island" in this cache would correspond to an 8-bit island of the L1.5 residing underneath 2 (recall that there are 2 eDRAM planes) 32-bit islands of the eDRAM.

Figure 3:
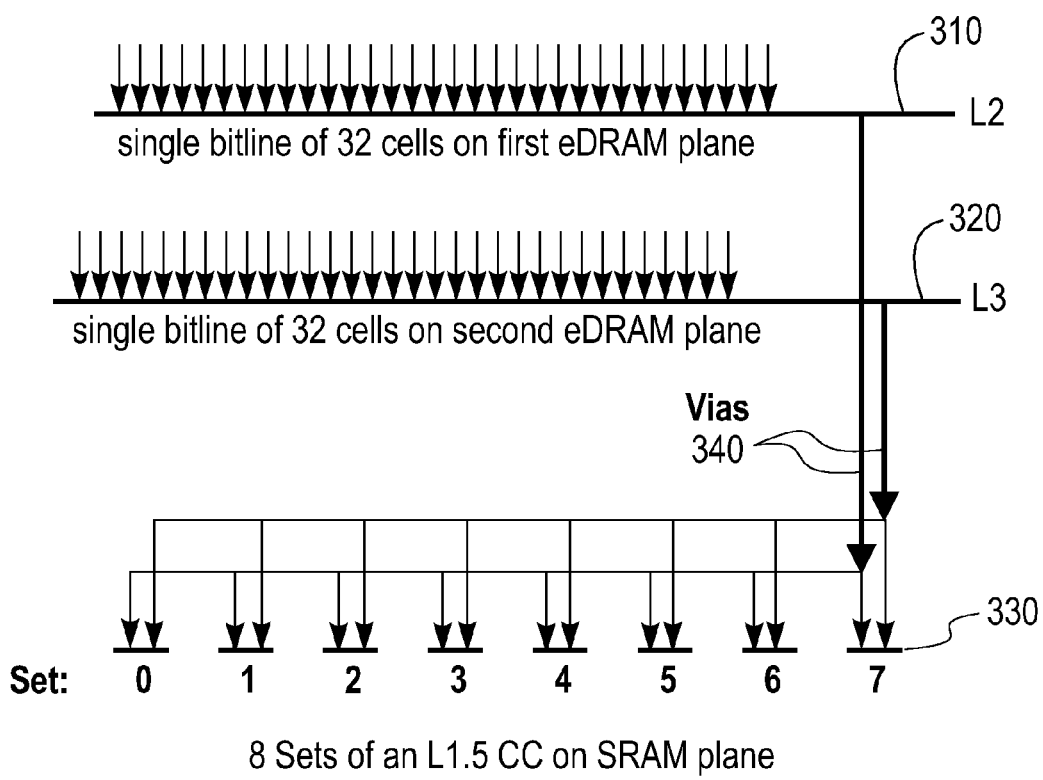
FIG. 3 exemplarily illustrates a bitline structure in which 32 bits in each of the eDRAM planes can drive the corresponding 8 bits on the SRAM plane.

This situation is shown in FIG. 3. That is, FIG. 3 exemplarily illustrates a bitline structure 300 in which 32 bits in each of the eDRAM planes 310, 320 can drive the corresponding 8 bits on the SRAM plane 330.

In FIG. 3, the data path is shown as having independent signals for each eDRAM plane. For a fixed number of vias, this would imply half the bus width (per line) than what was described above, although in this configuration, two lines could be moved at the same time (e.g., one from each eDRAM plane). Alternatively, a single via could be used, and only one plane could be selected at a time for transmission.

While these particular partitionings are too small to lead to good array efficiencies, they demonstrate that the total x-y (planar) motion required for an L2-L1.5 transfer is very small indeed, i.e., it can be made almost completely vertical. It is noted that since the vertical distance is small, e.g., 400 microns for the three 200-micron thick planes shown here, the transfer speeds can be much faster than what would be achievable in several millimeters of horizontal wiring (i.e., than what is possible in a plane). Additionally, since the capacitance is very small, the energy required per transfer is also much smaller.

Assuming that a real design would tradeoff array efficiency with the size of the islands (which determines the length of horizontal wire required in a transfer), the table below shows several ways to partition the caches, and the busses that result using 80K signal vias:

| # Congruence Classes Contained per Island | Bus Width per Island | # Bus Cycles to Transfer a Line | Total # of Lines in Flight Simultaneously |
|---|---|---|---|
| 1 | 16 | 16 | 512 |
| 2 | 32 | 8 | 256 |
| 4 | 64 | 4 | 128 |
| 8 | 128 | 2 | 64 |
| 16 | 256 | 1 | 32 |

The last row in the table basically represents the situation implied above—using 80K signal vias. That is, for a 256-byte bus width, we can transfer a 256-byte line in a single cycle. With our 80K signal vias, we can have 32 such busses, hence can have 32 lines in flight simultaneously. Partitioning the 512 congruence classes into 32 islands (each with its own bus) would put 16 congruence classes into each island—as shown in the first column.

On the other end of the spectrum, the first row shows that if one partitioned the cache into 512 islands, each having a single congruence class, then with 80K signal vias, each of the islands could only have a 16 byte bus, and it would take 16 cycles to move a 256 byte line. In this case, 512 lines can be in flight at the same time, but it takes longer to move a line.

Each row in the table shows a different partitioning, but each of the partitionings has the same bandwidth capacity: 8 Kilobytes per cycle.

Figure 4B:
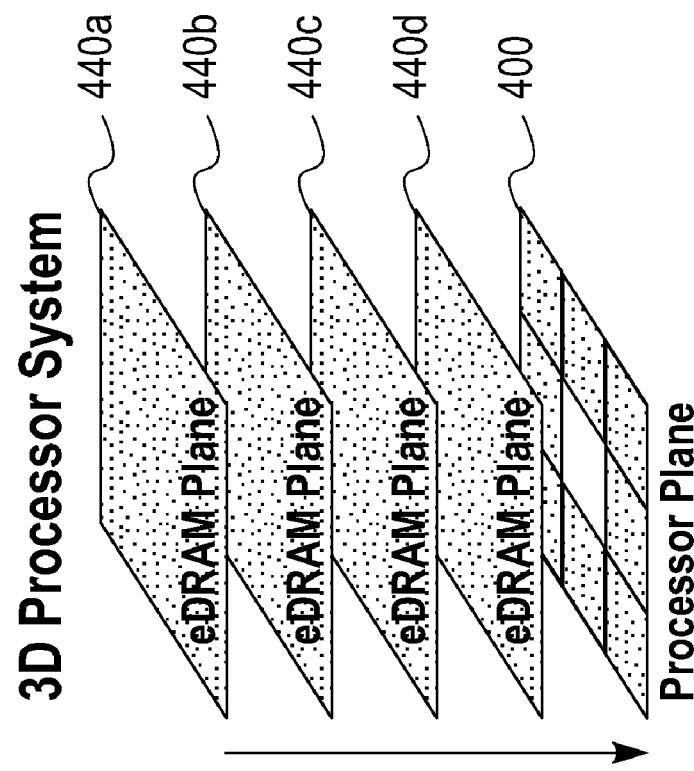
FIGS. 4A-4B exemplarily illustrate a multicore example of 8 processors, each with a private cache hierarchy and some intra-processor interconnection.
Figure 4A:
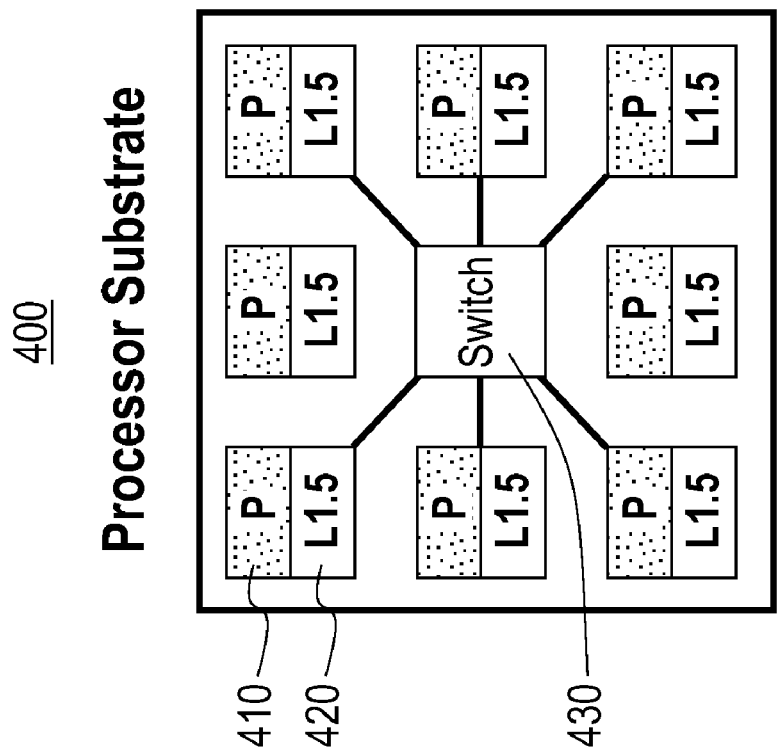

While the above descriptions pertain to a single L1.5/L2 pair, the question arises as to how this same reasoning applies to a multicore system. FIGS. 4A-4B illustrate a multicore example of 8 processors, each with a private hierarchy and some intra-processor interconnection.

That is, FIGS. 4A-4B show a generalization of a processor chip in which there are 8 processors, each with a private L1.5 cache. FIG. 4A shows the 8 processors with the L1.5s. Of course, the area is dominated by the L1.5s (which is not apparent in the conceptual view shown).

While any number of processors is acceptable, the reason that 8 was chosen in this example is that the chip can be partitioned into 9 similar regions, with the outside 8 regions each holding a processor and its cache, where the central region can be used for a switch, to handle traffic between the caches.

FIG. 4B shows that same 8-processor chip on the bottom of a stack of 4 memory chips (e.g., eDRAM) 440A-440D, although any number is feasible. Just as the bottom processor chip is partitioned into 9 physical regions, each of the memory chips above is so partitioned as well (although this isn't explicitly shown). Essentially, this system is just 8 copies of the single system described above, with some switching (at least on the processor chip, but perhaps on the memory chips as well) to facilitate intra-processor communications.

Figure 5:
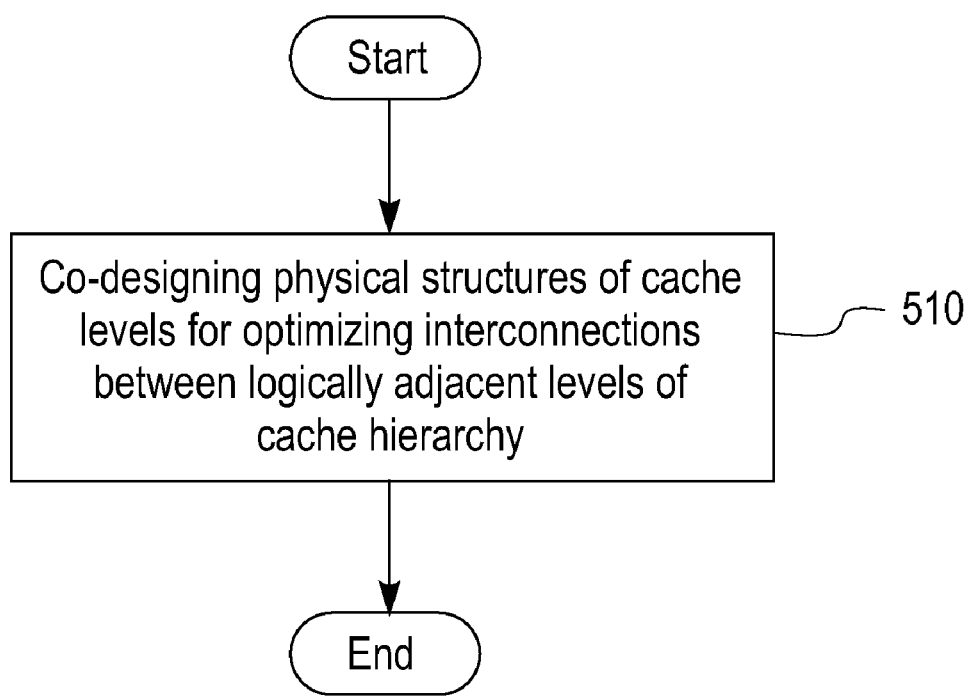
FIG. 5 illustrates an exemplarily method according to the present invention.

FIG. 5 shows an exemplarily method 500 according to the present invention for arranging bits within a cache hierarchy implemented on multiple physical planes such that horizontal wiring distances in intra-level busses are minimized. As shown in FIG. 5, the method can include co-designing physical structures of cache levels for optimizing interconnections between logically adjacent levels of the cache hierarchy, wherein the cache levels are physically positioned over each other.

Figure 6:
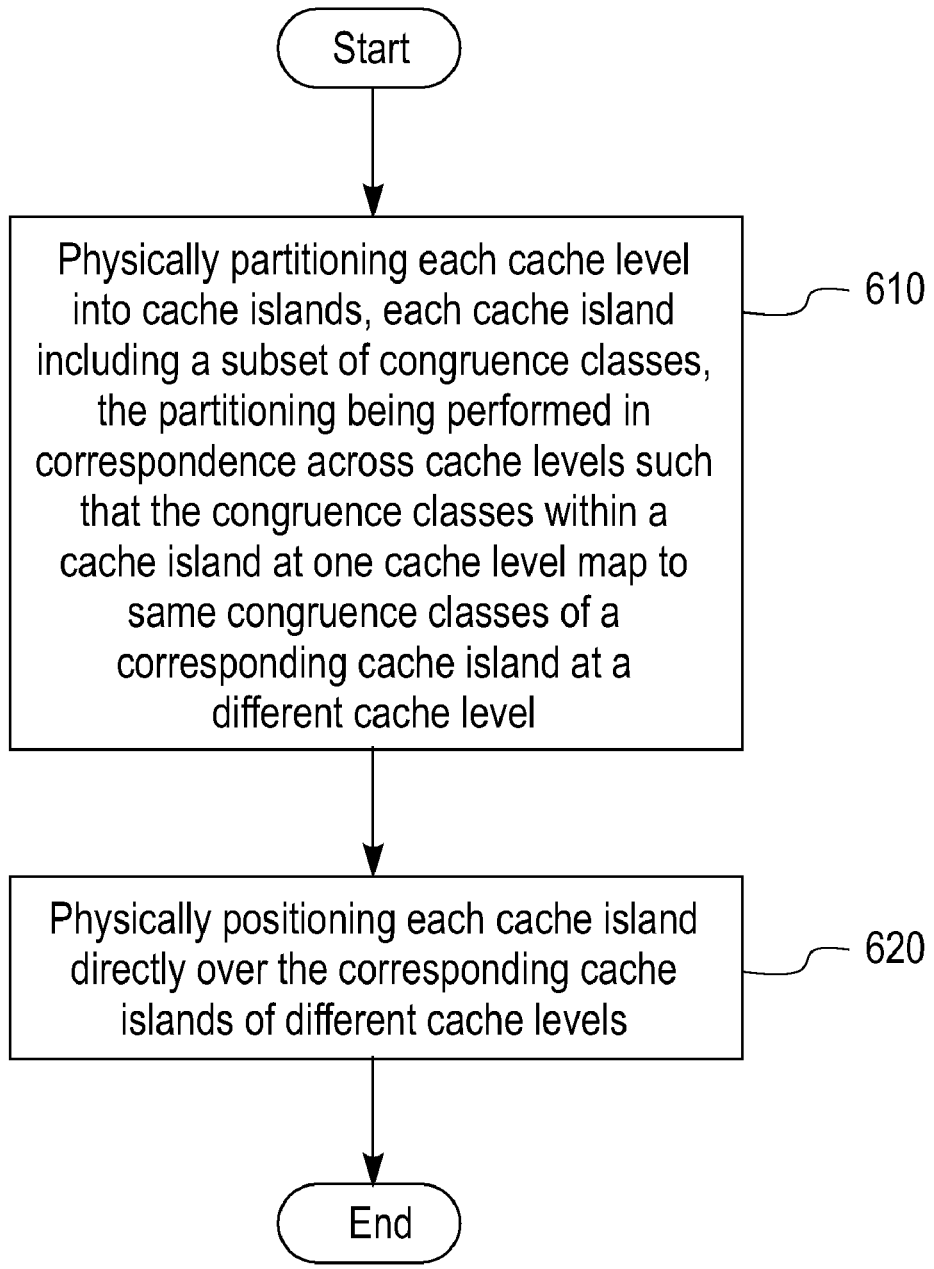
FIG. 6 illustrates another exemplarily method according to the present invention.

FIG. 6 shows an exemplarily method 60 according to the present invention for arranging bits within a cache hierarchy implemented on multiple physical planes such that horizontal wiring distances in intra-level busses are minimized. As shown in FIG. 6, the method can include the method can include physically partitioning each cache level into cache islands (e.g., step 610). It is noted that each cache island preferably can include a subset of congruence classes. It is also noted that the partitioning is performed in correspondence across cache levels such that the congruence classes within a cache island at one cache level map to same congruence classes of a corresponding cache island at a different cache level. The method 600 includes physically positioning each cache island directly over the corresponding cache islands of different cache levels (e.g., step 620).

While the invention has been described in terms of several exemplary aspects, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of arranging bits within a cache hierarchy implemented on multiple physical planes such that horizontal wiring distances in intra-level busses are minimized, said method comprising:

co-designing physical structures of cache levels for optimizing interconnections between logically adjacent levels of said cache hierarchy, wherein said cache levels are positioned over each other, wherein said co-designing comprises:

physically partitioning each said cache level into cache islands, each said cache island including a subset of congruence classes, wherein said partitioning is performed in correspondence across cache levels such that the congruence classes within a cache island at one cache level map to same congruence classes of a corresponding cache island at a different cache level, and wherein said cache islands are physically positioned directly over the corresponding cache islands of different cache levels.

2. The method according to claim 1, wherein said bits within said cache hierarchy are arranged to minimize horizontal transfers between said cache levels in the cache hierarchy.

3. The method according to claim 1, wherein adjacent cache levels are arranged to include different capacities.

4. The method according to claim 1, wherein adjacent cache levels are arranged to include same capacities.

5. The method according to claim 1, wherein one of said cache levels in the cache hierarchy comprises a plurality of physical planes.

6. The method according to claim 1, wherein areas of each cache level are arranged to be substantially the same.

7. The method according to claim 1, wherein said partitioning is selected to optimize a size of each said cache island.

8. A method of deploying computing infrastructure in which recordable, computer-readable code is integrated into a computing system, and combines with said computing system to perform the method according to claim 1.

9. A computer-readable medium tangibly embodying a program of machine readable instructions executable by a digital processing apparatus to perform a method of causing a computer to perform the method according to claim 1.

10. A method of arranging bits within a cache hierarchy implemented on multiple physical planes such that horizontal wiring distances in intra-level busses are minimized, said method comprising:
   physically partitioning each cache level into cache islands, each said cache island including a subset of congruence classes, wherein said partitioning is performed in correspondence across cache levels such that the congruence classes within a cache island at one cache level map to same congruence classes of a corresponding cache island at a different cache level; and
   positioning each said cache island over the corresponding cache islands of different cache levels, said cache islands being physically positioned directly over the corresponding cache islands of different cache levels.

11. The method according to claim 10, wherein said bits within said cache hierarchy are arranged to minimize horizontal transfers between said cache levels in the cache hierarchy.

12. The method according to claim 10, wherein adjacent cache levels are arranged to include different capacities.

13. The method according to claim 10, wherein adjacent cache levels are arranged to include same capacities.

14. The method according to claim 10, wherein one of said cache levels in the cache hierarchy comprises a plurality of physical planes.

15. The method according to claim 10, wherein areas of each cache level are arranged to be substantially the same.

16. The method according to claim 10, wherein said partitioning is selected to optimize a size of each said cache island.

17. A method of deploying computing infrastructure in which recordable, computer-readable code is integrated into a computing system, and combines with said computing system to perform the method according to claim 10.

18. A computer-readable medium tangibly embodying a program of machine readable instructions executable by a digital processing apparatus to perform a method of causing a computer to perform the method according to claim 10.

19. A cache hierarchy implemented on multiple physical planes such that horizontal wiring distances in intra-level busses are minimized, said cache hierarchy comprising:
   a plurality of cache levels physically partitioned into cache islands, each said cache island including a subset of congruence classes,
   wherein said cache levels are partitioned in correspondence across cache levels such that the congruence classes within a cache island at one cache level map to same congruence classes of a corresponding cache island at a different cache level, and
   wherein said cache islands are physically positioned directly over the corresponding cache islands of different cache levels.

20. The cache hierarchy according to claim 19, wherein adjacent cache levels include different capacities.

21. The cache hierarchy according to claim 19, wherein adjacent cache levels include same capacities.

22. The cache hierarchy according to claim 19, wherein areas of each cache level are substantially the same.

23. The cache hierarchy according to claim 19, wherein one of said cache levels in the cache hierarchy comprises a plurality of physical planes.

24. The cache hierarchy according to claim 19, wherein said partitioning is selected to optimize a size of each said cache island.

25. The cache hierarchy according to claim 19, wherein said cache hierarchy is arranged to minimize horizontal transfers between said cache levels in the cache hierarchy.

26. The cache hierarchy according to claim 19, wherein data paths between said cache levels comprise vias.

27. A design tool for designing a cache hierarchy according to claim 19, which is implemented on multiple physical planes such that horizontal wiring distances in intra-level busses are minimized.

28. A design tool comprising: a cache hierarchy according to claim 19, which is implemented on multiple physical planes such that horizontal wiring distances in intra-level busses are minimized.

29. A computer system, comprising:
   a cache hierarchy implemented on multiple physical planes such that horizontal wiring distances in intra-level busses are minimized, said cache hierarchy comprising:
   a plurality of cache levels physically partitioned into cache islands, each said cache island including a subset of congruence classes,
   wherein said cache levels are partitioned in correspondence across cache levels such that the congruence classes within a cache island at one cache level map to same congruence classes of a corresponding cache island at a different cache level, and
   wherein said cache islands are physically positioned directly over the corresponding cache islands of different cache levels.

* * * * *